United States Patent
Hori

(10) Patent No.: US 11,177,151 B2
(45) Date of Patent: Nov. 16, 2021

(54) SAMPLE HOLDER

(71) Applicant: KYOCERA Corporation, Kyoto (JP)

(72) Inventor: Youhei Hori, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 89 days.

(21) Appl. No.: 16/490,923

(22) PCT Filed: Mar. 8, 2018

(86) PCT No.: PCT/JP2018/008942
§ 371 (c)(1),
(2) Date: Sep. 4, 2019

(87) PCT Pub. No.: WO2018/180329
PCT Pub. Date: Oct. 4, 2018

(65) Prior Publication Data
US 2020/0013659 A1    Jan. 9, 2020

(30) Foreign Application Priority Data
Mar. 29, 2017   (JP) .............................. JP2017-065288

(51) Int. Cl.
| | | |
|---|---|---|
| H01L 21/683 | (2006.01) | |
| H02N 13/00 | (2006.01) | |
| H01J 37/32 | (2006.01) | |
| H01L 21/67 | (2006.01) | |

(52) U.S. Cl.
CPC ........ *H01L 21/6833* (2013.01); *H01L 21/683* (2013.01); *H02N 13/00* (2013.01); *H01J 37/32* (2013.01); *H01J 37/32724* (2013.01); *H01L 21/67069* (2013.01)

(58) Field of Classification Search
CPC .............. H01L 21/683; H01L 21/6833; H01L 21/67069; H02N 13/00; H01J 37/32; H01J 37/32724; H01J 37/62642
USPC ........................................................ 361/234
See application file for complete search history.

(56) References Cited

U.S. PATENT DOCUMENTS

| | | | | |
|---|---|---|---|---|
| 2011/0058303 A1* | 3/2011 | Migita | ................... | H02N 13/00 361/234 |
| 2015/0364355 A1* | 12/2015 | Kuchimachi | ..... | H01L 21/67103 156/345.52 |
| 2016/0196999 A1* | 7/2016 | Yanoh | ................... | C04B 37/028 361/234 |

(Continued)

FOREIGN PATENT DOCUMENTS

JP    2011-091297 A    5/2011

*Primary Examiner* — Danny Nguyen
(74) *Attorney, Agent, or Firm* — Volpe Koenig

(57) ABSTRACT

A sample holder includes an insulating substrate including a ceramic material and having a sample holding surface on one main surface thereof, a heat-generating resistor located on another main surface of the insulating substrate, a metal member facing the another main surface, and an adhesive layer covering the another main surface, the adhesive layer including a first layer which is in contact with the insulating substrate, and a second layer which is in contact with the metal member and having an elastic modulus that is smaller than an elastic modulus of the first layer, the second layer including a layered portion positioned between the first layer and the metal member, and an annular portion surrounding the first layer.

5 Claims, 4 Drawing Sheets

(56) References Cited

U.S. PATENT DOCUMENTS

2016/0240422 A1\* 8/2016 Takahashi ............ H01L 21/6831
2018/0269097 A1\* 9/2018 Maeta ............... H01J 37/32724

\* cited by examiner

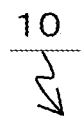
FIG. 1
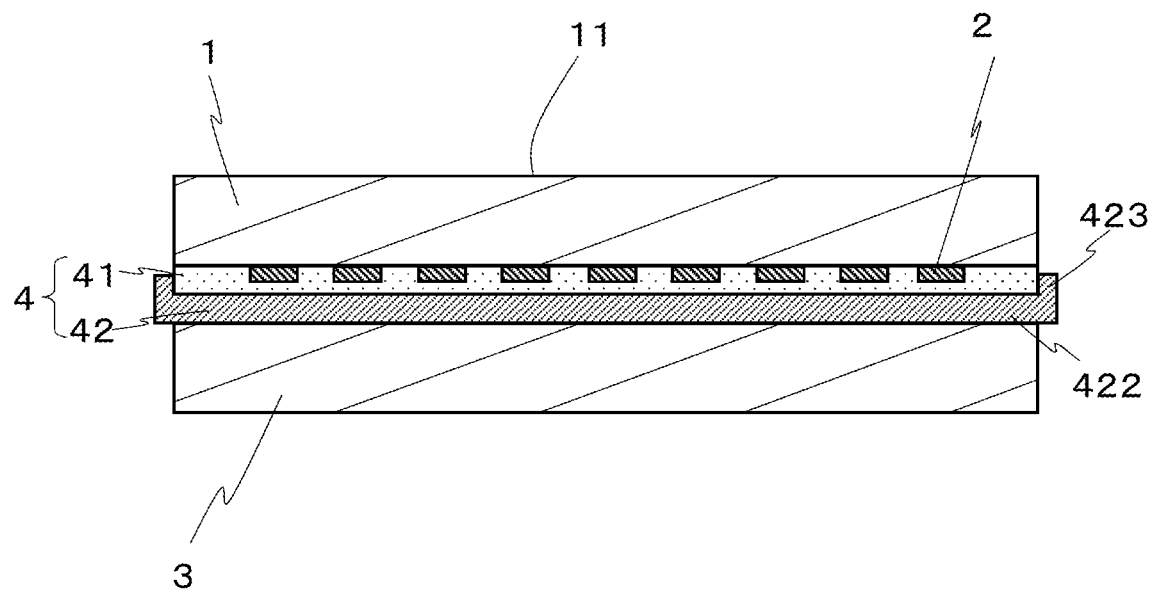
FIG. 2
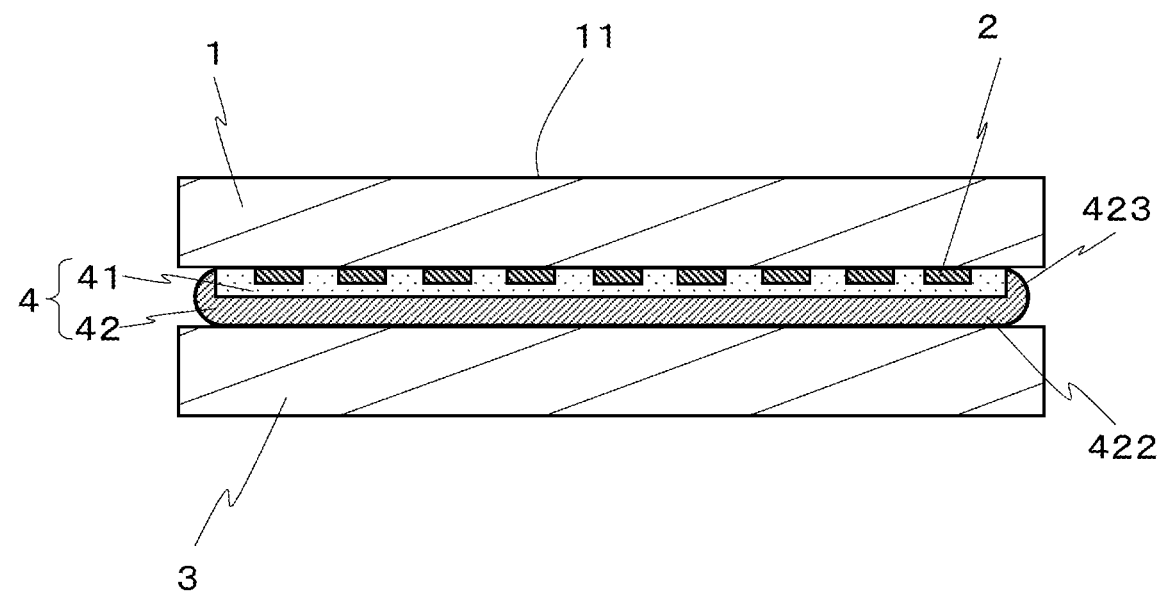

SAMPLE HOLDER

CROSS-REFERENCE TO RELATED APPLICATIONS

This application is a national stage entry according to 35 U.S.C. 371 of International Application No. PCT/JP2018/008942 filed on Mar. 8, 2018, which claims priority to Japanese Patent Application No. 2017-065288 filed on Mar. 29, 2017, the contents of which are entirely incorporated herein by reference.

TECHNICAL FIELD

The present disclosure relates to a sample holder used for holding a sample such as a semiconductor wafer or the like, in a manufacturing process of a semiconductor integrated circuit or in a manufacturing process of a liquid crystal display device, such as, plasma etching or the like.

BACKGROUND

As a sample holder, for example, an electrostatic chuck described in Japanese Unexamined Patent Publication JP-A 2011-91297 (hereinafter referred to as Patent Literature 1) is known. The electrostatic chuck disclosed in Patent Literature 1 includes a metallic base substrate, an electrostatic chuck substrate, a heater located between the base substrate and the electrostatic chuck substrate, and an adhesive layer which bonds the heater to the base substrate. Further, the adhesive layer includes a first adhesive layer, and a second adhesive layer which is formed into a gel by curing an adhesive having a lower viscosity than a viscosity of the first adhesive layer.

SUMMARY

A sample holder according to the disclosure includes an insulating substrate including a ceramic material and having a sample holding surface on one main surface thereof, a heat-generating resistor located on another main surface of the insulating substrate, a metal member facing the another main surface, and an adhesive layer covering the another main surface, the adhesive layer including a first layer which is in contact with the insulating substrate, and a second layer which is in contact with the metal member and having an elastic modulus that is smaller than an elastic modulus of the first layer, the second layer including a layered portion positioned between the first layer and the metal member, and an annular portion surrounding the first layer.

BRIEF DESCRIPTION OF DRAWINGS

FIG. 1 is a cross-sectional view showing an example of a sample holder;
FIG. 2 is a cross-sectional view showing another example of the sample holder.

DETAILED DESCRIPTION

Figure 3:
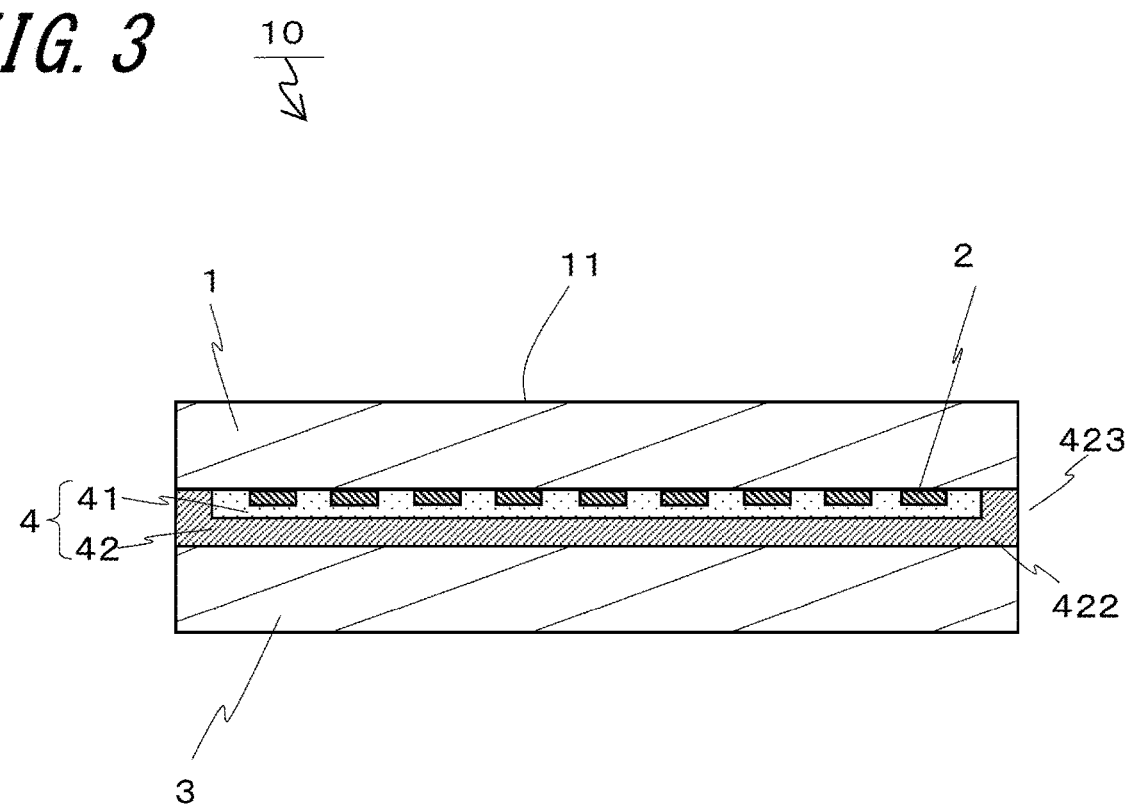
FIG. 3 is a cross-sectional view showing another example of the sample holder.

An example of a sample holder according to the disclosure will be described in detail with reference to the drawings.

FIG. 1 is a cross-sectional view showing a sample holder 10 according to an example of the disclosure. As shown in FIG. 1, the sample holder 10 includes an insulating substrate 1 formed of ceramics and having a sample holding surface 11 on one main surface, a heat-generating resistor 2 located on another main surface of the insulating substrate 1, and a metal member 3 located to cover the another main surface of the insulating substrate 1 through an adhesive layer 4.

The insulating substrate 1 is a member for holding a sample. A shape of the insulating substrate 1 is a disk shape, for example. The insulating substrate 1 includes the sample holding surface 11 on one main surface. The insulating substrate 1 includes ceramics such as alumina, aluminum nitride, silicon nitride or yttria, for example. For example, when the insulating substrate 1 has a disk shape, the dimensions of the insulating substrate 1 may be set such that a diameter of the main surface is 200 to 500 mm and a height of the insulating substrate is 0.5 to 15 mm. An electrode for electrostatic attraction may be located in the insulating substrate 1 as necessary.

The heat-generating resistor 2 is a member which generates heat when current flows. The heat-generating resistor 2 is configured to heat the sample held by the sample holding surface 11. The heat-generating resistor 2 is located on the another main surface of the insulating substrate 1. The heat-generating resistor 2 is located on substantially the entirety of the another main surface of the insulating substrate 1, for example. The heat-generating resistor 2 has a linear pattern including a plurality of folds, for example. As a result, the heat-generating resistor 2 may uniformly heat the entirety of the sample holding surface 11. The heat-generating resistor 2 includes a metallic material such as silver-palladium, platinum, aluminum, or gold, for example. Further, the heat-generating resistor 2 may also contain a glass component such as an oxide of a material such as silicon, aluminum, bismuth, calcium, boron or zinc. The dimensions of the heat-generating resistor 2 may be 0.5 to 3 mm in width, 0.01 to 0.1 mm in thickness, and 25 to 35 m in total length, for example.

The metal member 3 is provided to support the insulating substrate 1. The metal member 3 is located to cover the another main surface of the insulating substrate 1 through the adhesive layer 4. The metal member 3 may also serve as a cooling plate for cooling the insulating substrate 1. The metal member 3 may be provided with a cooling channel for circulating a heat medium such as gas or liquid. In this case, liquid such as water or silicone oil, or gas such as helium or nitrogen may be used as the heat medium. The metal member 3 has a disk shape or a square shape, for example. Regarding this metal member 3, for example, one main surface of the metal member 3 may be bonded to the another main surface of the insulating substrate 1 by the adhesive layer 4.

The metal member 3 includes a metal having a relatively high thermal conductivity. The term "metal" as used herein also includes composite materials formed of metals, such as composite materials of ceramics and metals and fiber reinforced metals. The metal member 3 may be formed of aluminum, copper, stainless copper or nickel or an alloy of these metals when the sample holder 10 is used in an environment exposed to halogen-based corrosive gases or the like. The dimensions of the metal member 3 may be 200 to 500 mm in diameter and 15 to 50 mm in thickness when the metal member 3 has a disk shape, for example. When the cooling channel is provided in the metal member 3, the dimensions of the channel may be 3 to 10 mm in width, 5 to 15 mm in height, and 2 to 8 m in total length, for example.

When the sample holder 10 is used as a plasma etching device, the metal member 3 may include a high frequency applying electrode (not shown).

The adhesive layer 4 is a member for bonding the insulating substrate 1 and the metal member 3. The adhesive layer 4 is located between the insulating substrate 1 and the metal member 3. The adhesive layer 4 is spread on the another main surface of the insulating substrate 1. Further, the adhesive layer 4 is configured to cover the heat-generating resistor 2 located on the another main surface of the insulating substrate 1. The adhesive layer 4 may contain a filler component such as ceramic particles in order to improve the thermal conductivity. Regarding the filler, for example, a metal material such as aluminum or a ceramic material such as alumina, silicon carbide, aluminum nitride or silicon nitride may be used.

The adhesive layer 4 includes a first layer 41 which is in contact with the insulating substrate 1 and a second layer 42 which is in contact with the metal member 3. An elastic modulus of the first layer 41 is higher than an elastic modulus of the second layer 42. As a result, it is possible to increase an elastic modulus of a portion of the adhesive layer 4 which covers the heat-generating resistor 2. Therefore, under the heat cycle, when the thermal expansion occurs in the heat-generating resistor 2, the thermal expansion of the heat-generating resistor 2 may be suppressed by the first layer 41. As a result, the thermal stress is concentrated between the insulating substrate 1 and the heat-generating resistor 2, and it is possible to reduce the possibility that crack occurs between the insulating substrate 1 and the heat-generating resistor 2. As a result, it is possible to improve the durability of the sample holder 10. Regarding the first layer 41, for example, a resin material such as epoxy or silicone may be used. In addition, the elastic modulus as used herein refers to the elastic modulus of the adhesive layer 4 in which a filler or the like is contained, rather than the elastic modulus of the base material which forms the adhesive layer 4.

Further, an elastic modulus of the second layer 42 is lower than an elastic modulus of the first layer 41. As a result, it is possible to decrease the elastic modulus of the portion of the adhesive layer 4 which is in contact with the metal member 3. Under the heat cycle, the metal member 3 with a large thermal expansion coefficient is more likely to be thermally expanded, and the second layer 42 may be deformed due to the low elastic modulus of the second layer 42 when the metal member 3 is thermally expanded. Therefore, it is possible to reduce the possibility that the thermal stress is concentrated between the metal member 3 and the adhesive layer 4. As a result, it is possible to reduce the possibility that peel-off occurs between the metal member 3 and the adhesive layer 4. As a result, it is possible enhance the durability of the sample holder 10.

For example, when an epoxy resin is used for the first layer 41, a resin material such as epoxy or silicone may be used for the second layer 42. When the first layer 41 and the second layer 42 are formed of the same material, the elastic modulus of the first layer 41 may be higher than the elastic modulus of the second layer 42 by adding a filler having a high elastic modulus to the first layer 41, for example. In addition, the second layer 42 is formed of a material having a lower elastic modulus than the elastic modulus of the first layer 41 and contains a filler having a high elastic modulus, and the elastic modulus of the second layer 42 in which the filler is contained may be lower than the elastic modulus of the first layer 41.

When the adhesive layer 4 contains a filler or the like, the elastic modulus of the adhesive layer 4 may be measured by an ultrasonic pulse method. Regarding the measurement method, for example, for measuring the elastic modulus of the second layer 42, the insulating substrate 1, the heat-generating resistor 2, and the first layer 41 are cut off by grinding from the sample holder 10, and the second layer 42 is machined into a sample having an area of 10 $mm^2$ or larger, and the elastic modulus may be calculated by introducing longitudinal wave signal and transverse wave signal of several MHz onto the surface of the sample through the oscillator of an ultrasonic pulse receiver, and detecting the reflected waves from the bottom of the sample and determining speeds of the longitudinal waves and the transverse waves from the time period when the ultrasonic wave propagates in the sample. As a measuring device, HVPULSER/RECEIVER (5058PR) manufactured by PANAMETRICS may be used, for example. In addition, the same method as described above may also be used for measuring the adhesive layer 41.

Further, the dimensions of the adhesive layer 4 may be set such that the first layer 41 is 0.05 to 1 mm in thickness, and the second layer 42 is 0.1 to 3 mm in thickness, for example. The adhesive layer 4 may include a layer other than the first layer 41 and the second layer 42 between the first layer 41 and the second layer 42. At this time, an elastic modulus of the layer other than the first layer 41 and the second layer 42 may be higher than the elastic modulus of the first layer 41 or may be lower than the elastic modulus of the second layer 42.

According to the sample holder 10 of the disclosure, as shown in FIG. 1, the second layer 42 is wrapped around the insulating substrate 1 side to cover an outer periphery of the first layer 41. As a result, when a force is applied to an outer periphery of the adhesive layer 4, a portion of the second layer 42, which is wrapped around the insulating substrate 1 side to cover the outer periphery of the first layer 41, is deformed, and therefore it is possible to absorb the force applied to the outer periphery of the adhesive layer 4. Therefore, it is possible to reduce the force applied to the portion of the second layer 42 except the wrapped-around portion, and to the first layer 41. As a result, it is possible to reduce the possibility that crack occurs in the portion of the second layer 42 except the wrapped-around portion, and in the first layer 41. Therefore, it is possible to improve the reliability of bonding between the insulating substrate 1 and the metal member 3. As a result, it is possible to improve the durability of the sample holder 10.

In this example, the portion of the second layer 42 which is wrapped around the insulating substrate 1 side to cover the outer periphery of the first layer 41 includes both the portion of the second layer 42 which covers the outer periphery of the first layer 41 and the portion of the second layer 42 which extends to the outside of the outer periphery of the first layer 41 to cover the outer periphery of the first layer 41. The dimensions of the portion of the second layer 42 which is wrapped around the insulating substrate 1 side to cover the outer periphery of the first layer 41 may be 0.1 to 3 mm in thickness and 0.5 to 5 mm in width, for example.

In addition, since the second layer 42 is wrapped around the insulating substrate 1 side to cover the outer periphery of the first layer 41, a boundary surface between the first layer 41 and the portion of the second layer 42 except the wrapped-around portion may be covered with the wrapped-around portion of the second layer 42. Therefore, when crack occurs on the outer periphery of the adhesive layer 4, it is possible to reduce the possibility that the crack develops in a straight line at the boundary surface between the first layer 41 and the portion of the second layer 42 excluding the wrapped-around portion. Therefore, it is possible to improve the reliability of bonding between the insulating substrate 1 and the metal member 3. As a result, it is possible to improve the durability of the sample holder 10.

In the sample holder 10 shown in FIG. 1, the second layer 42 extends to the outer side than the outer periphery of the insulating substrate 1, but as shown in FIG. 2, the first layer 41 extends but remains inside the outer periphery of the insulating substrate 1, and the second layer 42 may be wrapped around the insulating substrate 1 side to cover the outer periphery of the first layer 41 inside the outer periphery of the insulating substrate 1. Further, the outer periphery of the adhesive layer 4 may be rounded as shown in FIG. 2.

Further, as shown in FIG. 3, the second layer 42 may cover entirely the outer periphery of the first layer 41 and may be in contact with the another main surface of the insulating substrate 1. As a result, even when crack occurs between the insulating substrate 1 and the first layer 41, since the second layer 42 is in contact with the another main surface of the insulating substrate 1, it is possible to reduce the possibility that the heat-generating resistor 2 is exposed to the outside. Therefore, it is possible to reduce the possibility that the outside air or the like enters the crack and reacts with the heat-generating resistor 2. As a result, it is possible to reduce the possibility that the resistance value of the heat-generating resistor 2 is changed, and the amount of heat generation is changed. As a result, it is possible to improve the thermal uniformity of the sample holder 10.

Figure 4:
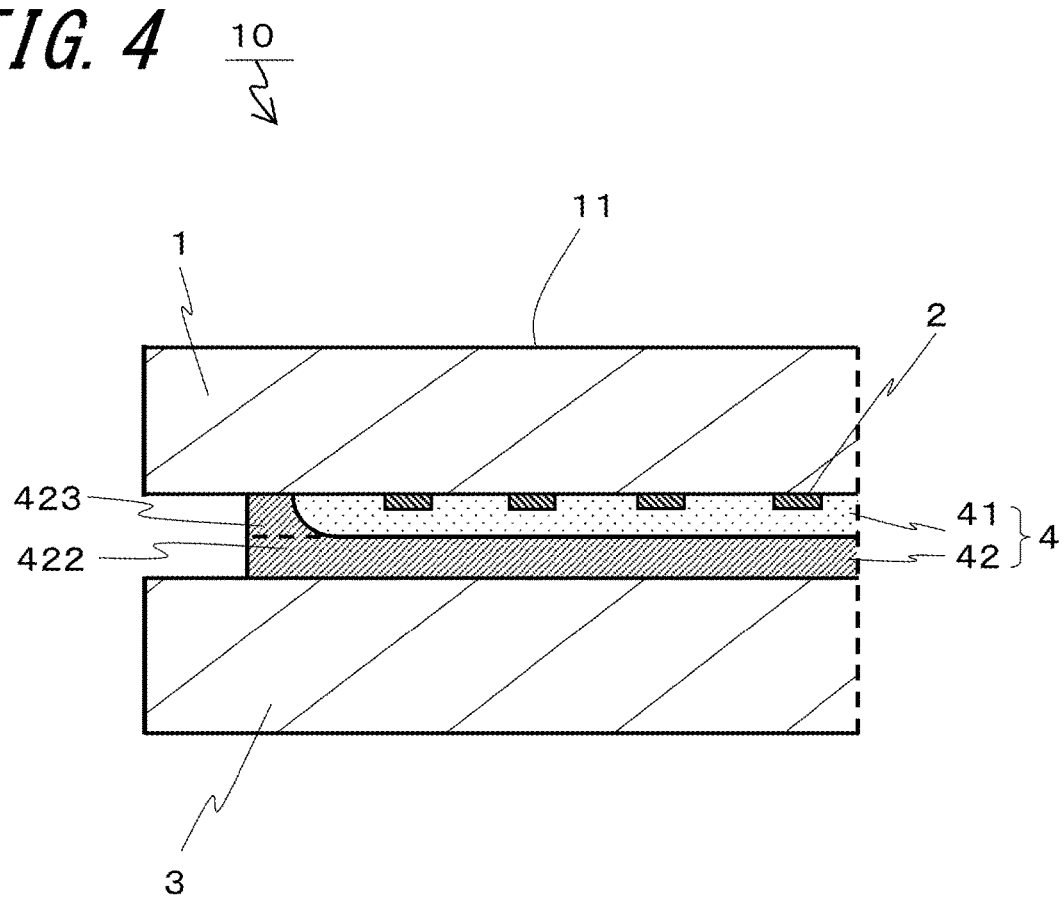
FIG. 4 is a partially enlarged view showing another example of the sample holder.

Further, as shown in FIG. 4, the boundary surface between the first layer 41 and the second layer 42 may be smooth. In other words, when viewed in cross-section, the boundary surface resulting from the second layer 42 being wrapped around the outer periphery of the first layer 41 may be rounded. Under the heat cycle, although a force may be applied to the boundary surface between the first layer 41 and the second layer 42 due to the difference in thermal expansion coefficients between the first layer 41 and the second layer 42, the smooth boundary surface between the first layer 41 and the second layer 42 allows the force applied to the boundary surface between the first layer 41 and the second layer 42 to be dispersed. As a result, it is possible to reduce the possibility that crack occurs in the adhesive layer 4. Therefore, it is possible to improve the reliability of bonding between the insulating substrate 1 and the metal member 3. As a result, it is possible to improve the durability of the sample holder 10.

In addition, a thermal conductivity of the first layer 41 may be smaller than a thermal conductivity of the second layer 42. Thus, it is possible to reduce the possibility that the heat generated in the heat-generating resistor 2 is transferred from the first layer 41 to the second layer 42 when the temperature is increased. Therefore, the heat generated by the heat-generating resistor 2 may be efficiently transferred to the sample holding surface 11. As a result, it is possible to speed up the temperature increase in the sample holding surface 11. Further, since the thermal conductivity of the second layer 42 is larger than the thermal conductivity of the first layer 41, the heat possessed by the first layer 41 may be easily transferred from the second layer 42 to the metal member 3 when the temperature is decreased. Therefore, the heat in the insulating substrate 1 may be efficiently transferred to the metal member 3. As a result, it is possible to speed up the temperature decrease in the sample holding surface 11.

Figure 5:
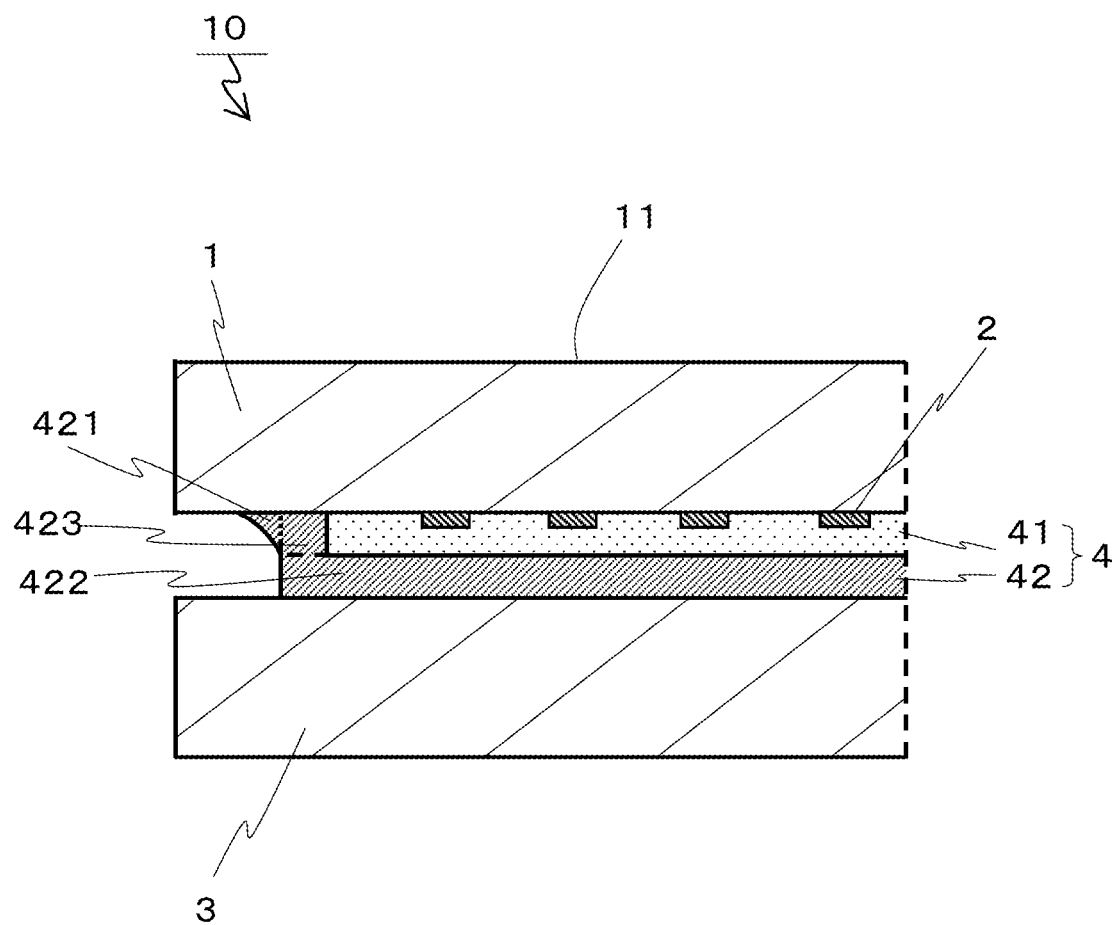
FIG. 5 is a partially enlarged view showing another example of the sample holder.

In addition, as shown in FIG. 5, the second layer 42 may include a meniscus portion 421, the meniscus portion 421 extending along the another main surface of the insulating substrate 1 when seen in a cross-section perpendicular to the sample holding surface. As a result, when seen in the cross-section shown in FIG. 5, as compared with the example where the second layer 42 is planar up to the tip of the meniscus portion 421, the area of the portion of the another main surface of the insulating substrate 1 which is in contact with the second layer 42 may be increased without increasing the volume of the portion of the second layer 42 which is wrapped around the insulating substrate 1 to cover the outer periphery of the first layer 41. Therefore, it is possible to enhance the bonding strength between the insulating substrate 1 and the adhesive layer 4, while the thermal stress generated in the portion of the second layer 42 which is wrapped around the insulating substrate 1 side to cover the outer periphery of the first layer 41 is reduced. As a result, it is possible to improve the durability of the sample holder 10.

In addition, the meniscus portion 421 may be located entirely on the another main surface of the insulating substrate 1 in a circumferential direction thereof. As a result, the heat generated by the heat-generating resistor 2 may be uniformly transferred to the insulating substrate 1 through the meniscus portion 421, so that it is possible to enhance the heat uniformity of the sample holding surface 11. Here, the meniscus portion 421 referred to herein is a portion which is in a meniscus shape and which has a thickness which gradually decreases toward the outer periphery of the insulating substrate 1. The dimensions of the meniscus portion 421 may be 0.1 to 3 mm in thickness and 0.5 to 5 mm in width, for example.

Figure 6:
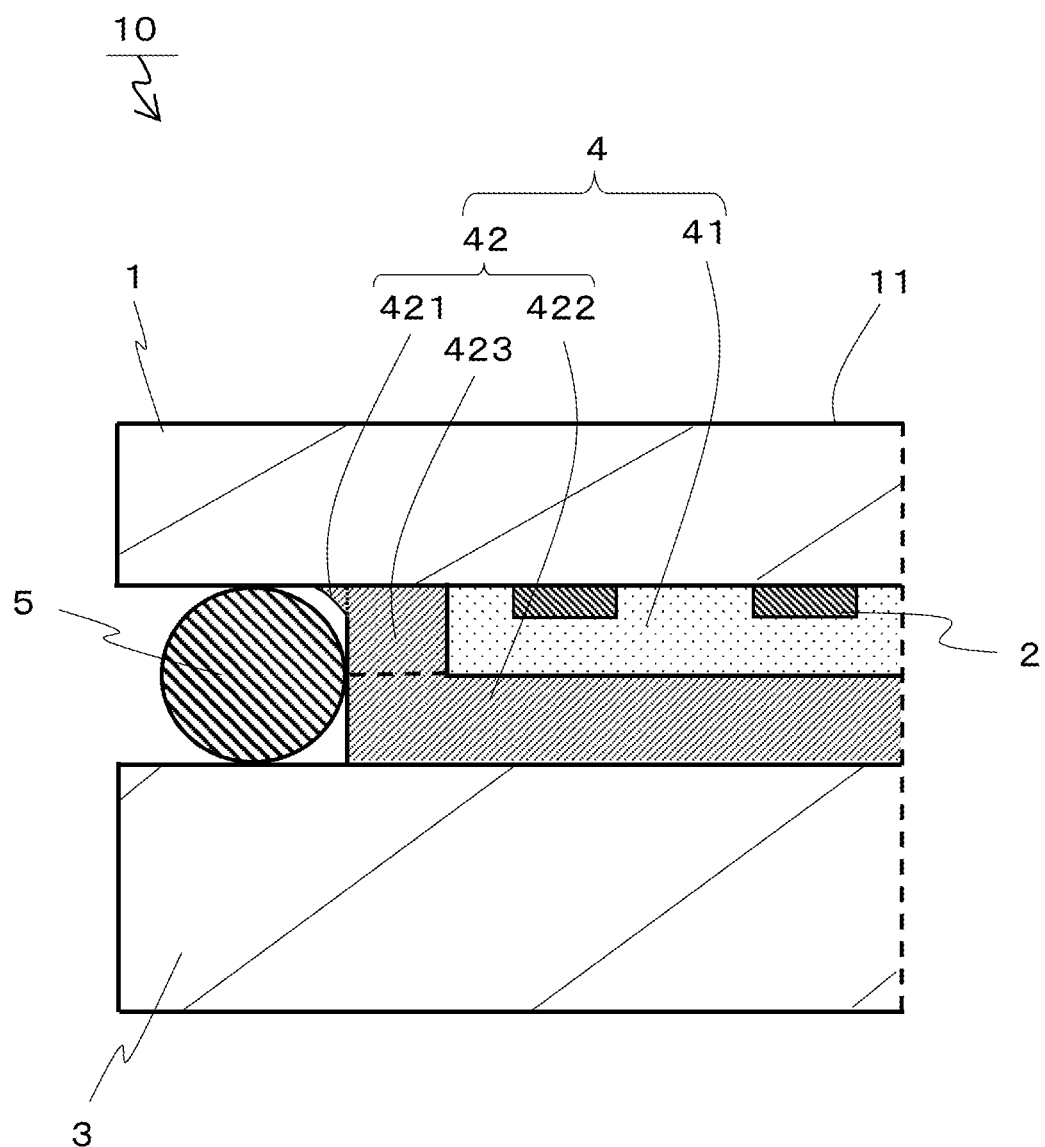
FIG. 6 is a partially enlarged view showing another example of the sample holder.

Moreover, as shown in FIG. 6, a ring member 5, which is provided to surround the adhesive layer 4 in the circumferential direction, may be additionally provided. As a result, when the sample holder 10 is used as a plasma etching device, it is possible to reduce the possibility that the plasma gas comes in contact with the adhesive layer 4. In addition, the ring member 5 may be in contact with the second layer 42 (a portion except the meniscus portion 421), while having a gap from the meniscus portion 421. Since the ring member 5 is in contact with the second layer 42 while having a gap from the meniscus portion 421, it is possible to reduce the possibility that an external force is transferred to the meniscus portion 421 when the ring member 5 is subjected to the external force. Therefore, it is possible to reduce the possibility that crack occurs between the insulating substrate 1 and the meniscus portion 421. As a result, it is possible to reduce the possibility that peel-off occurs between the insulating substrate 1 and the second layer 42. Therefore, it is possible to improve the reliability of bonding of the insulating substrate 1 and the adhesive layer 4. As a result, it is possible to improve the durability of the sample holder 10.

In addition, the ring member 5 may be in contact with the insulating substrate 1 and the second layer 42 while having a gap from the meniscus portion 421. Thus, when an external force is applied to the ring member 5, the external force may be dispersed to the insulating substrate 1 and the adhesive layer 4. Therefore, it is possible to reduce the possibility that a strong force is applied to the adhesive layer 4. As a result, it is possible to reduce the possibility that the bonding portion between the adhesive layer 4 and the insulating substrate 1 breaks. As a result, it is possible to improve the durability of the sample holder 10.

In addition, the ring member 5 may be in contact with the insulating substrate 1 and the metal member 3 along the entire circumference thereof. As a result, when the sample holder 10 is used as a plasma etching device, it is possible to reduce the possibility that the plasma gas comes in contact with the adhesive layer 4. Therefore, it is possible to reduce the possibility that the plasma gas enters the adhesive layer 4 and reacts with the heat-generating resistor 2. As a result, it is possible to reduce the possibility that the resistance value of the heat-generating resistor 2 is changed, and the amount of heat generation is changed. As a result, it is possible to improve the thermal uniformity of the sample holder 10.

Here, the shape of the ring member 5 may be circular or oval when seen in the cross-section shown in FIG. 6, for example. The ring member 5 may be formed of a resin material such as epoxy, silicone, or fluorocarbon resin. The dimensions of the ring member 5 may be 0.075 to 2 mm in radius when in a circular shape as seen in the cross-section shown in FIG. 6, for example. Further, the dimensions of the ring member 5 may be 196 to 500 mm in inner diameter and 200 to 504 mm in outer diameter, when seen in a plan view on a plane horizontal to the sample holding surface 11, for example.

In addition, as shown in FIGS. 1 to 6, the second layer 42 may include a layered portion 422 positioned between the first layer 41 and the metal member 3 and an annular portion 423 surrounding the first layer 41. As a result, when a force is applied to the annular portion 423, the force applied to the annular portion 423 may be absorbed by the deformation of the annular portion 423. Therefore, it is possible to reduce the force applied to the first layer 41 and the layered portion 422. As a result, it is possible to reduce the possibility that cracks occurs in the first layer 41 and the layered portion 422. Therefore, it is possible to improve the reliability of bonding between the insulating substrate 1 and the metal member 3. As a result, it is possible to improve the durability of the sample holder 10.

In this example, the layered portion 422 may be the portion of the second layer 42 except the wrapped-around portion, for example. The annular portion 423 may be a portion of the second layer 42 which covers the outer periphery of the first layer 41, for example. The second layer 42 may include a portion other than the layered portion 422 and the annular portion 423.

Further, as shown in FIG. 3, the annular portion 423 may surround the entirety of the first layer 41 and be in contact with the another main surface of the insulating substrate 1. As a result, even when crack occurs between the insulating substrate 1 and the first layer 41, since the second layer 42 is in contact with the another main surface of the insulating substrate 1, it is possible to reduce the possibility that the heat-generating resistor 2 is exposed to the outside. Therefore, it is possible to reduce the possibility that the outside air or the like enters the crack and reacts with the heat-generating resistor 2. As a result, it is possible to reduce the possibility that the resistance value of the heat-generating resistor 2 is changed, and the amount of heat generation is changed. As a result, it is possible to improve the thermal uniformity of the sample holder 10.

REFERENCE SIGNS LIST

1: Insulating substrate
11: Sample holding surface
2: Heat-generating resistor
3: Metal member
4: Adhesive layer
41: First layer
42: Second layer
421: Meniscus portion
422: Layered portion
423: Annular portion
5: Ring member
10: Sample holder

The invention claimed is:

1. A sample holder, comprising:
an insulating substrate comprising a ceramic material and having a sample holding surface on one main surface thereof;
a heat-generating resistor located on another main surface of the insulating substrate;
a metal member facing the another main surface; and,
an adhesive layer covering the another main surface, the adhesive layer comprising
a first layer which is in contact with the heat-generating resistor and covering the heat-generating resistor whereby the heat-generating resistor is disposed between the first layer and the insulating substrate, and
a second layer which is in contact with the metal member and having an elastic modulus that is smaller than an elastic modulus of the first layer, the second layer comprising a layered portion positioned between the first layer and the metal member, and an annular portion surrounding the first layer.

2. The sample holder according to claim 1, wherein the annular portion surrounds an entirety of the first layer and is in contact with the another main surface of the insulating substrate.

3. The sample holder according to claim 1, wherein a thermal conductivity of the first layer is smaller than a thermal conductivity of the second layer.

4. The sample holder according to claim 2, wherein the second layer further comprises a meniscus portion, the meniscus portion extending along the another main surface of the insulating substrate when seen in a cross-section perpendicular to the sample holding surface.

5. The sample holder according to claim 4, further comprising an annular ring member which surrounds the adhesive layer in a circumferential direction thereof, the annular ring member being in contact with the second layer and having a gap from the meniscus portion.

* * * * *